(12) United States Patent
Howe et al.

(10) Patent No.: US 10,950,282 B2
(45) Date of Patent: *Mar. 16, 2021

(54) METHODS FOR ON-DIE MEMORY TERMINATION AND MEMORY DEVICES AND SYSTEMS EMPLOYING THE SAME

(71) Applicant: Micron Technology, Inc., Boise, ID (US)

(72) Inventors: Gary Howe, Allen, TX (US); Eric J. Stave, Meridian, ID (US); Thomas H. Kinsley, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/540,011

(22) Filed: Aug. 13, 2019

(65) Prior Publication Data

US 2019/0371379 A1 Dec. 5, 2019

Related U.S. Application Data

(63) Continuation of application No. 16/047,954, filed on Jul. 27, 2018, now Pat. No. 10,424,356.

(Continued)

(51) Int. Cl.
*G11C 7/22* (2006.01)
*G11C 7/10* (2006.01)
(Continued)

(52) U.S. Cl.
CPC .......... *G11C 7/222* (2013.01); *G06F 13/4086* (2013.01); *G11C 7/1045* (2013.01);
(Continued)

(58) Field of Classification Search
None
See application file for complete search history.

(56) References Cited

U.S. PATENT DOCUMENTS 8,243,534 B2 * 8/2012 Fujisawa ............... G11C 5/04
365/193
8,279,689 B2 10/2012 Das
(Continued)

OTHER PUBLICATIONS

International Application No. PCT/US2018/044434—International Search Report and Written Opinion, dated Nov. 14, 2018, 15 pages.

*Primary Examiner* — Tan T. Nguyen
(74) *Attorney, Agent, or Firm* — Perkins Coie LLP

(57) ABSTRACT

Methods, systems, and apparatuses related to memory operation with on-die termination (ODT) are provided. A memory device may be configured to provide ODT at a first portion (e.g., rank) during multiple communications at a second portion (e.g., rank). For example, a memory device may receive a first command instructing a first portion to perform a first communication and instructing a second portion to enter an ODT mode. The device may perform, with the first portion, the first communication with a host while the second portion is in the ODT mode. The device may receive a second command instructing the first portion to perform a second communication, and the device may perform, with the first portion, the second communication while the second portion remains in the ODT mode. The second portion may persist in the ODT mode for an indicated number of communications, or until instructed to exit the ODT mode.

16 Claims, 8 Drawing Sheets

Related U.S. Application Data

(60) Provisional application No. 62/590,096, filed on Nov. 22, 2017.

(51) Int. Cl.
    *G06F 13/40* (2006.01)
    *G11C 8/10* (2006.01)

(52) U.S. Cl.
    CPC .......... *G11C 7/1057* (2013.01); *G11C 7/1084* (2013.01); *G11C 7/1096* (2013.01); *G11C 8/10* (2013.01); *G11C 2207/10* (2013.01)

(56) References Cited

U.S. PATENT DOCUMENTS

| | | | |
|---|---|---|---|
| 10,424,356 B2 * | 9/2019 | Howe | G11C 7/222 |
| 2005/0212551 A1 | 9/2005 | So et al. | |
| 2010/0302893 A1 | 12/2010 | Sato et al. | |
| 2014/0016401 A1 | 1/2014 | Komyo et al. | |
| 2016/0373111 A1 | 12/2016 | Shaeffer | |
| 2017/0077928 A1 | 3/2017 | Bains et al. | |
| 2017/0093400 A1 | 3/2017 | Bains et al. | |
| 2017/0097790 A1 | 4/2017 | Doo et al. | |
| 2017/0125092 A1 * | 5/2017 | Hirashima | G11C 7/1084 |
| 2017/0243629 A1 * | 8/2017 | Chen | G06F 13/4086 |
| 2018/0026634 A1 * | 1/2018 | Park | G11C 7/1006 326/30 |
| 2018/0039588 A1 * | 2/2018 | Yun | G11C 5/04 |
| 2018/0342274 A1 * | 11/2018 | Son | G11C 7/1051 |
| 2019/0139585 A1 * | 5/2019 | Kim | G11C 7/1084 |
| 2019/0156871 A1 | 5/2019 | Howe et al. | |
| 2020/0204179 A1 * | 6/2020 | Lee | G06F 3/0604 |

* cited by examiner

METHODS FOR ON-DIE MEMORY TERMINATION AND MEMORY DEVICES AND SYSTEMS EMPLOYING THE SAME

CROSS-REFERENCE TO RELATED APPLICATIONS

This application is a continuation of U.S. application Ser. No. 16/047,954, filed Jul. 27, 2018; which claims the benefit of U.S. Provisional Application No. 62/590,096, filed Nov. 22, 2017; each of which is incorporated herein by reference in its entirety.

TECHNICAL FIELD

The present disclosure generally relates to methods for on-die memory termination and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Memory devices and memory systems can include multiple separately-addressable memory arrays, ranks, banks, channel, or other sub-divisions of memory capacity. In some such devices and systems, multiple separately-addressable memory portions may have terminals connected to one or more common busses (e.g., a data bus, a command/address bus, a clock signal bus, etc.). To improve the signal quality on a bus during communication with one of the separately-addressable portions, one or more terminals of another non-communicating memory portion may enter an "on-die termination" (ODT) mode, in which the impedance at the one or more terminals of the non-communicating portion is modified (e.g., to minimize signal reflections or other potentially signal-degrading or noise-contributing effects).

In some memory systems, a connected host device can indicate to the non-communicating (e.g., non-targeted) memory portion to enter an on-die termination mode with a command (e.g., on a command/address bus) addressed specifically to the non-targeted memory portion. Each command to enter an ODT mode can cause a command decoder of the non-targeted memory portion to consume power in decoding the command, which can contribute to a significant increase in the power consumption of a memory system. It is therefore desirable to provide a way to manage the ODT modes of a memory system with greater power efficiency.

Accordingly, several embodiments of the present technology are directed to memory devices, systems including memory devices, and methods of operating memory devices in which on-die termination can be provided at a second portion during multiple communications at a first portion, without requiring multiple on-die termination commands to be provided to or decoded by the second portion. In one embodiment, a method may comprise receiving a first command instructing a first memory device to perform a first communication and instructing a second memory device to enter an on-die termination mode, performing, with the first memory device, the first communication while the second memory device is in the on-die termination mode based at least in part on the first command, receiving a second command instructing the first memory device to perform a second communication with the memory host, and performing, with the first memory device, the second communication while the second memory device is in the on-die termination mode based at least in part on the first command.

Figure 1:
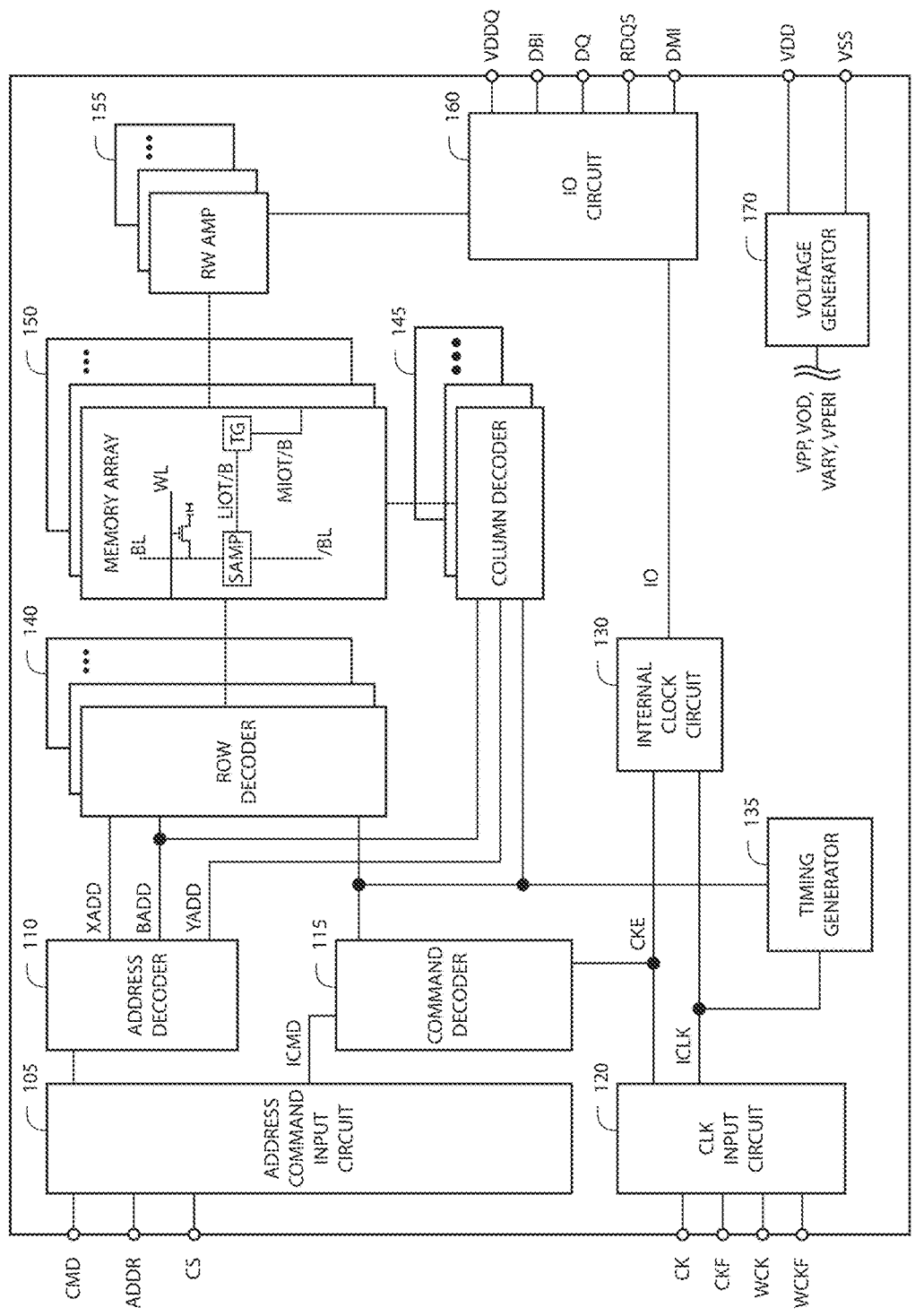
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can provide memory capacity with multiple memory arrays, or with a single array that is sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., clock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory. When operating such a memory device, to reduce undesirable noise on a common signal path (e.g., a clock path, a data bus, etc.), the memory device can utilize on-die termination to provide proper impedance at those terminals of the memory device corresponding to the separately-addressable portions of memory that are not communicating on the common signal path. For example, when a connected host or memory controller accesses a first channel of the memory device, terminals of the memory device corresponding to a second channel can be provided with proper impedance by on-die termination circuitry (e.g., integral to a corresponding i/o circuit 160, clock input circuit 120, or the like).

One approach to initiating on-die termination includes a host providing a signal (e.g., via a dedicated or shared pin or terminal) or command (e.g., via the command/address bus) to the non-targeted portion of the memory device to provide termination during a communication performed by a targeted portion of the memory device. For example, a command on a shared command/address bus can indicate to both the targeted and non-targeted portion that a communication (e.g., a read operation, a write operation, an erase operation, a status inquiry operation, etc.) is to be performed, while dedicated chip select terminals for each portion can indicate which portion is targeted (e.g., by a pulse lasting a single clock cycle) and which is non-targeted (e.g., by a pulse lasting two clock cycles). Such an approach is illustrated schematically in the timing diagram 200 of FIG. 2, in accordance with one aspect of the present technology.

Figure 2:
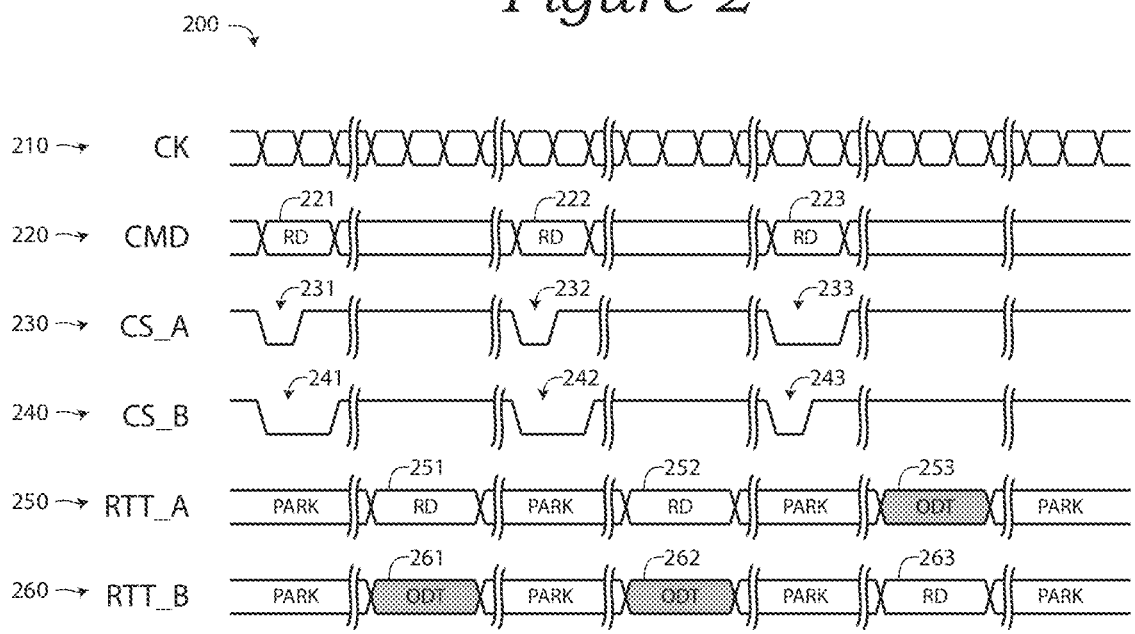
FIGS. 2-5 are simplified timing diagrams schematically illustrating the operation of memory devices and systems in accordance with embodiments of the present technology.

As can be seen with reference to FIG. 2, in a memory device or system with two or more separately-addressable portions (e.g., two channels of a memory device, two memory devices of a memory system, etc.), a common command/address bus 220 can be used to indicate to the portions that a communication is to be performed by one of the portions (e.g., via a read command). A dedicated chip select terminal for each portion (e.g., CS_A 230 and CS_B 240) can be used to provide an indication to each portion whether it is targeted or non-targeted for the communication. In response to receiving an indication that is not the target of a command to communicate, the non-targeted portion can enter an on-die termination mode for the duration of the communication. In this regard, the timing diagram 200 of FIG. 2 illustrates a sequence of read commands targeting different channels of a memory device.

As illustrated, the first read command 221 is sent with corresponding indications 231 and 241 on the chip select terminals 230 and 240 that the target of the first read command corresponds to the first channel 250 of the memory device (e.g., by pulsing a chip select line low for one cycle of a clock 210 to indicate the targeted portion, and for two cycles of the clock 210 to indicate the non-targeted portion). Accordingly, the second channel 260 of the memory device enters an on-die termination mode 261 for the duration of a communication 251 of the first channel 250. Following the communication 251, the second channel 260 returns to a default or "parked" mode of impedance. A second read command 222 is similarly sent with corresponding indications 232 and 242 on the chip select terminals 230 and 240 that the target of the second read command corresponds to the first channel 250 of the memory device. Accordingly, the second channel 260 of the memory device enters an on-die termination mode 262 for the duration of a communication 252 of the first channel 250. Following the communication 252, the second channel 260 returns to the parked mode of impedance. A third read command 223 is sent with corresponding indications 233 and 243 on the chip select terminals 230 and 240 that the target of the third read command corresponds to the second channel 260 of the memory device. Accordingly, the first channel 250 of the memory device enters an on-die termination mode 253 for the duration of a communication 263 of the second channel 260. Following the communication 263, the first channel 250 returns to the parked mode of impedance.

A drawback to this approach of providing on-die termination commands to a non-targeted memory portion with each command to a targeted portion (e.g., with a corresponding indication on a chip select terminal) is that the non-targeted memory portion consumes power in decoding each command. In this regard, the command decoder of a memory device (e.g., command decoder 115) may be configured to "wake up" (e.g., to deliver power or signal voltages to one or more components previously in a no-power, low-power, or signal-disconnected state) in response to pulsing a corresponding chip select line low (e.g., whether for one or two clock cycles). Moreover, alternating the impedance from a parked mode to a termination mode (e.g., a read termination mode, a write termination mode, etc.) and back may further consume additional power. Accordingly, embodiments of the present technology may solve the foregoing problems by providing on-die termination at a non-targeted memory portion without the power consumption caused by decoding a non-targeted communication (e.g., read, write, status, etc.) command. Rather, in one embodiment, a memory portion can be configured to provide on-die termination in response to a command received in connection with a previous communication command.

Figure 3:
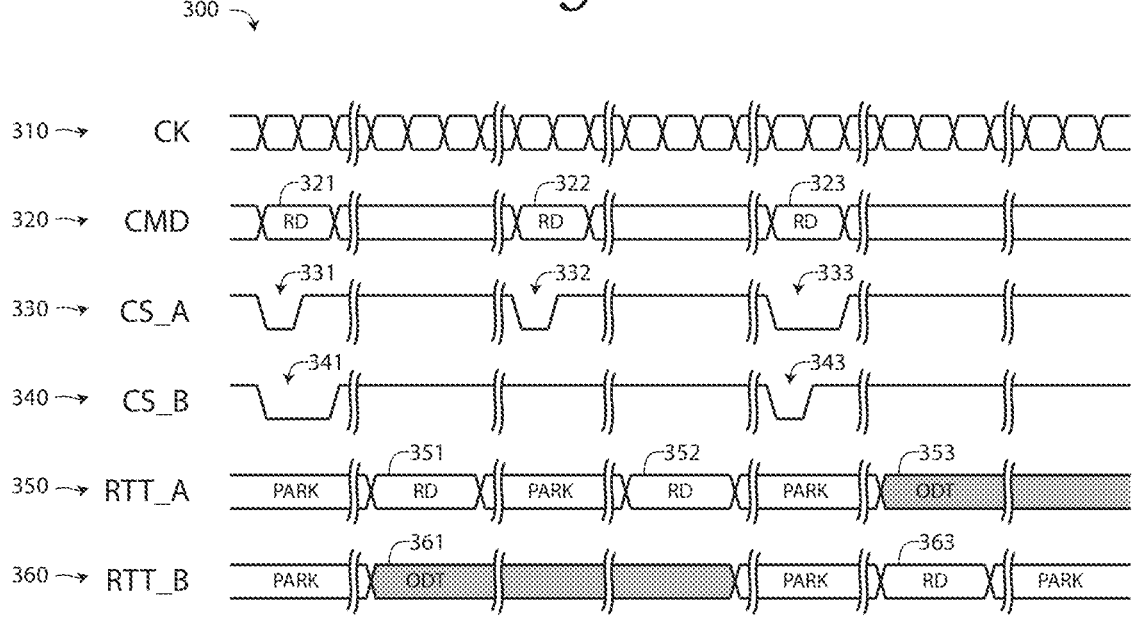

Turning to FIG. 3, a simplified timing diagram 300 schematically illustrates the operation of a memory system in accordance with an embodiment of the present technology. As can be seen with reference to FIG. 3, in a memory device or system with two or more separately-addressable portions (e.g., two channels of a memory device, two memory devices of a memory system), a common command/address bus 320 can be used to indicate to the portions that a communication is to be performed by one of the portions (e.g., via a read command). Unlike the approach illustrated in FIG. 2, however, in the approach illustrated in FIG. 3, in response to an indication to a memory portion that it is not the target of a communication, the memory portion enters and remains in an on-die termination mode until receiving a subsequent indication or command to exit the on-die termination mode.

In the example of FIG. 3, a first read command 321 is sent with corresponding indications 331 and 341 on the chip select terminals 330 and 340 that the target of the first read command corresponds to the first channel 350 of the memory device (e.g., by pulsing a chip select line low for one cycle of a clock 310 to indicate the targeted portion, and for two cycles of the clock 310 to indicate the non-targeted portion). Accordingly, the second channel 360 of the memory device enters an on-die termination mode 361 for the duration of a communication 351 of the first channel 350. Rather than returning to a parked mode of impedance following the completion of the communication 351, however, the second channel 360 remains in the on-die termination mode 361. Accordingly, during subsequent communications for which the second channel remains non-targeted, no further indications need be sent to nor commands decoded by the second channel to provide on-die termination thereat.

For example, as can be seen with reference to FIG. 3, a second read command 322 is sent with an indication 332 on the chip select terminal 330 that the target of the second read command corresponds to the first channel 350 of the memory device. No indication is sent on the chip select terminal 340 corresponding to the second channel 360, however, ensuring that the command decoder of the second channel need not consume power processing the command 322. Rather, the second channel 360 of the memory device remains in the on-die termination mode 361 initiated for the earlier communication 351, and continues to provide termination for the duration of a communication 352 of the first channel 350. When a third read command 323 is subsequently sent with corresponding indications 333 and 343 on the chip select terminals 330 and 340 that the target of the third read command corresponds to the second channel 360 of the memory device (e.g., by pulsing a chip select line low for one cycle of a clock 310 to indicate the targeted portion, and for two cycles of the clock 310 to indicate the non-targeted portion), the second channel 360 of the memory device exits the on-die termination mode 361 and performs the communication 363, and the first channel 350 of the memory device enters an on-die termination mode 353 (e.g., and may be, like the second channel 360, configured to remain therein until receiving a command to exit the on-die termination mode 353).

Although in the foregoing example embodiment, the on-die termination mode 361 is illustrated and described as persisting for the duration of two communications, in other embodiments a persistent on-die termination mode can last for many more communications (e.g., and/or for extended periods during which no communication are taking place). In this regard, a persistent on-die termination mode can be configured to persist until a command (e.g., a communication command targeting the memory portion providing termination, or a command to exit the termination mode without communicating) is received. For each communication for which a memory portion provides termination without requiring the consumption of power in decoding an on-die termination command, the power savings of the present approach will be increased, as compared to the approach illustrated in FIG. 2.

In accordance with another aspect of the present disclosure, a persistent on-die termination mode can remain in effect until one or more of a number of different criteria for ending the mode are met. In this regard, a persistent on-die termination can be configured to persist until the receipt of (i) a read command targeting the addressed to the memory portion, (ii) a write command addressed to the terminated memory portion, (iii) a non-targeted termination command addressed to the memory portion (e.g., with a different termination level), (iv) a command to exit the termination mode, or (v) a self-refresh command. In one embodiment, a command to exit the termination mode (a "TermOFF" command) can be executed based on a predetermined delay (e.g., as configured in a predetermined mode register) to facilitate scheduling. In some embodiments, a TermOFF command can be provided immediately following a column access select ("CAS") command to a different memory portion, such that execution of the TermOFF command following the predetermined delay can ensure a change in the termination mode corresponds in time with the execution of the CAS command. The TermOFF command can be either a single-clock-cycle command or a multiple-clock-cycle command.

Figure 4:
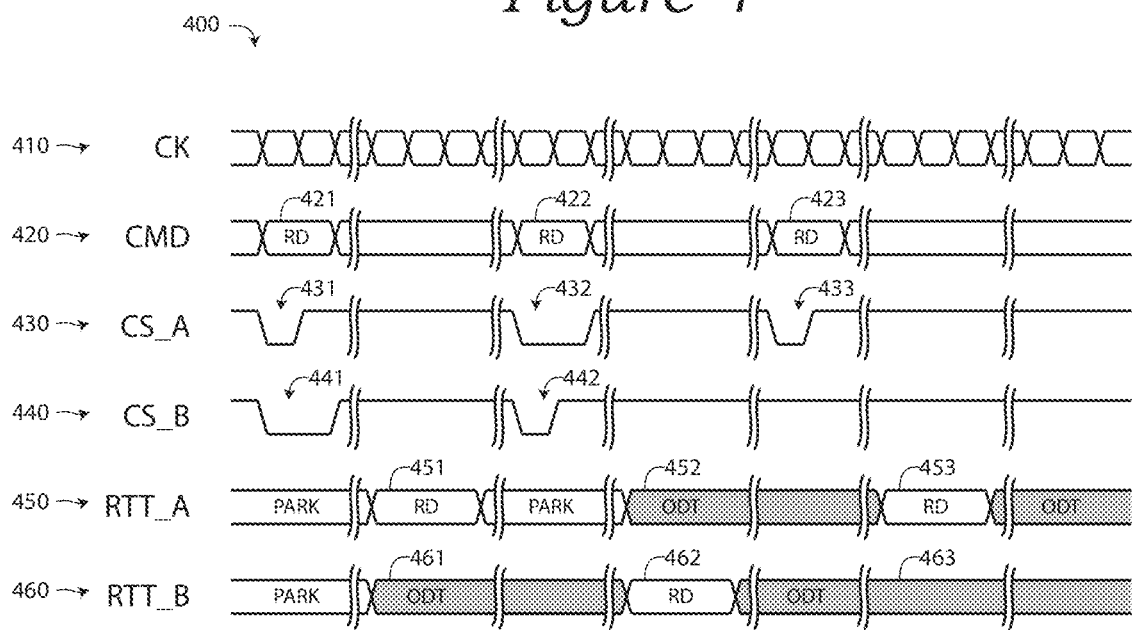

Turning to FIG. 4, a simplified timing diagram 400 schematically illustrates the operation of a memory system in accordance with another embodiment of the present technology. As can be seen with reference to FIG. 4, in a memory device or system with two or more separately-addressable portions (e.g., two channels of a memory device, two memory devices of a memory system), a common command/address bus 420 can be used to indicate to the portions that a communication is to be performed by one of the portions (e.g., via a read command). Unlike the approach illustrated in FIG. 3, however, in the approach illustrated in FIG. 4, in response to an indication to a memory portion that it is not the target of a communication, the memory portion enters an on-die termination mode to which it reverts following subsequent commands to communicate (e.g., unless instructed otherwise).

In the example of FIG. 4, a first read command 421 is sent with corresponding indications 431 and 441 on the chip select terminals 430 and 440 that the target of the first read command corresponds to the first channel 450 of the memory device (e.g., by pulsing a chip select line low for one cycle of a clock 410 to indicate the targeted portion, and for two cycles of the clock 410 to indicate the non-targeted portion). Accordingly, the second channel 460 of the memory device enters an on-die termination mode 461 at least for the duration of a communication 451 of the first channel 450. When a second read command 422 is sent with indications 431 and 432 on the chip select terminals 430 and 440 that the target of the second read command corresponds to the second channel 460 of the memory device, the first channel 450 of the memory device enters an on-die termination mode 452 at least for the duration of a communication 462 of the second channel 460. Because the second channel 460 is configured to revert to its previous on-die termination mode following the completion of the communication 462, no subsequent indication need be sent on the corresponding chip select terminal 440, and the second channel 460 of the memory device reverts to an on-die termination mode 463 rather than a parked mode of termination. Accordingly, when a third read command 423 is sent with an indication 433 on the chip select terminal 430 that the target of the third read command corresponds to first channel 450 of the memory device, no indication is sent on the second chip select terminal 440, as the second channel 460 has already reverted to the on-die termination mode 463, which provides the desired termination while the first channel 450 of the memory device performs the commanded communication 453.

Although in the foregoing example embodiments, the communications performed by one memory portion while another is in an on-die termination mode have been described and illustrated as read operations (e.g., with corresponding read levels of on-die termination), in other embodiments of the present technology, the foregoing and following approaches can similarly be applied to other communications (e.g., write operations, status operations, etc.), with corresponding levels of termination (e.g., non-targeted write level termination, non-targeted status level termination, etc.).

Figure 5:
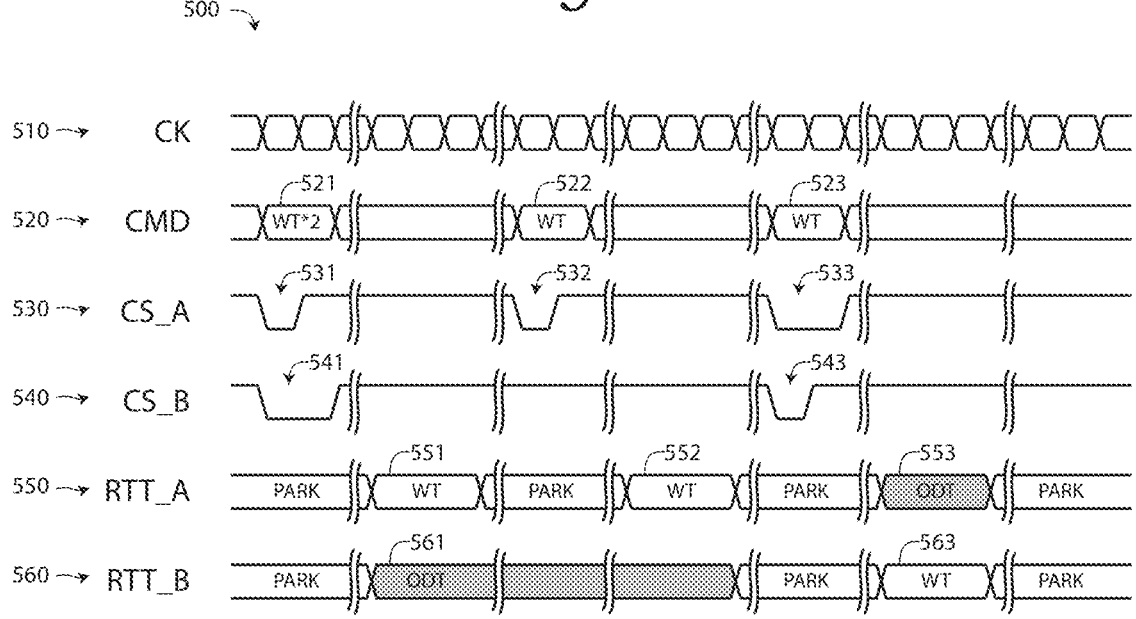

For example, turning to FIG. 5, a simplified timing diagram 500 schematically illustrates the operation of a memory system in accordance with another embodiment of the present technology. As can be seen with reference to FIG. 5, in a memory device or system with two or more separately-addressable portions (e.g., two channels of a memory device, two memory devices of a memory system), a common command/address bus 520 can be used to indicate to the portions that a communication is to be performed by one of the portions (e.g., via a write command).

In the approach illustrated in FIG. 5, in response to an indication to a memory portion that it is not the target of a communication, the memory portion enters an on-die termination mode in which it remains for an indicated duration (e.g., for an indicated number of subsequent communications). In this regard, a first write command 521 is sent with corresponding indications 531 and 541 on the chip select terminals 530 and 540 that the target of the first read command corresponds to the first channel 550 of the memory device (e.g., by pulsing a chip select line low for one cycle of a clock 510 to indicate the targeted portion, and for two cycles of the clock 510 to indicate the non-targeted portion). The write command 521 can include an indication (e.g., in otherwise-unused bits on the command/address bus 520) to the non-targeted portion of the memory device to provide on-die termination for a number of subsequent communications (e.g., in the illustrated example, for two communications). Accordingly, the second channel 560 of the memory device enters an on-die termination mode 561 and the first channel 550 performs a communication 551 (e.g., the requested write operation).

In the example of FIG. 5, a second write command 522 is sent with an indication 531 on the chip select terminal 530 that the target of the second write command corresponds to the first channel 550 of the memory device. Because the second channel 560 was previously commanded (e.g., by write command 521) to remain in the on-die termination mode 561 for the duration of two communication events, no subsequent indication need be sent on the corresponding chip select terminal 540, and the second channel 560 continues to provide termination during the second communication 552. Following the completion of the second communication 552, the on-die termination mode 561 is exited, and the second channel reverts to a default "parked" mode of termination. When a third read command 523 is sent with corresponding indications 533 and 543 on the chip select terminals 530 and 540 that the target of the third read command corresponds to the second channel 560 of the memory device, the first channel 550 of the memory device enters an on-die termination mode 553 for the duration of a communication 563 of the second channel 560. Following the termination mode 553, the first channel 550 returns to the parked mode of impedance.

According to one aspect of the present technology, the various foregoing approaches (e.g., persisting in an on-die termination mode, reverting to an on-die termination mode, and commanding an on-die termination mode to last for more than one communication) can be combined in a variety of ways to provide additional approaches. For example, the approach of reverting to a previous on-die termination mode can be combined with the approach of instructing on-die termination to last for a predetermined number of communications (e.g., by instructing a memory portion to provide write-level on-die termination for three communications, after which the memory portion reverts to a previous on-die termination mode, such as a read-level on-die termination).

Although in the foregoing example embodiments, memory devices and systems with just two memory portions (e.g., and just two corresponding chip select terminals) have been illustrated, the foregoing approaches to on-die termination have application to memory devices and systems with more than two channels or other sub-addressable portions. As will be readily understood by those skilled in the art, the power-saving benefits of these approaches will be even greater for devices in which more on-die termination commands corresponding to a single communication command can be omitted.

Figure 6:
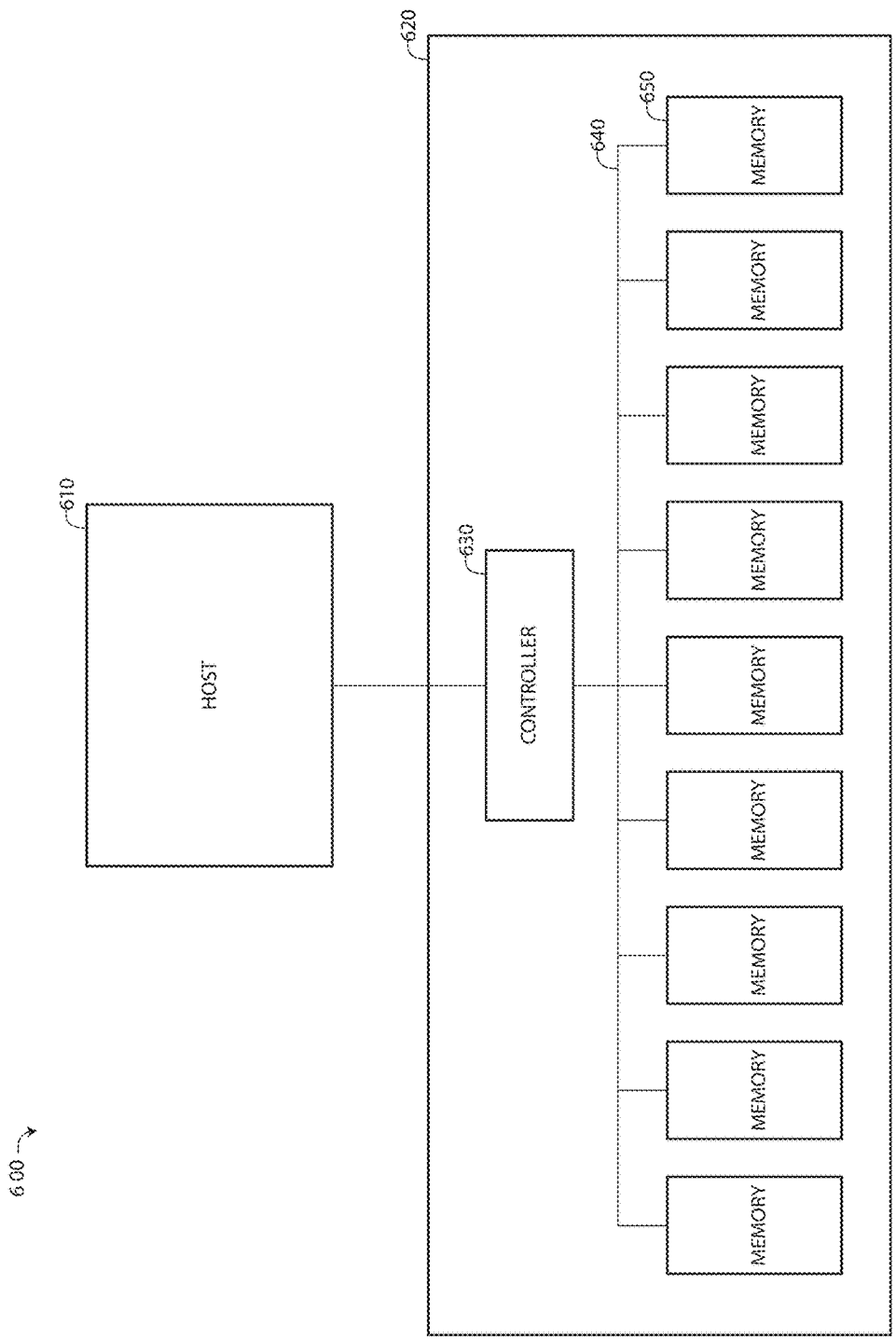
FIG. 6 is a simplified block diagram schematically illustrating a memory system in accordance with an embodiment of the present technology.

FIG. 6 is a simplified block diagram schematically illustrating a memory system 600 in accordance with an embodiment of the present technology. Memory system 600 includes a host device 610 operably coupled to a memory module 620 (e.g., a dual in-line memory module (DIMM)). Memory module 620 can include a controller 630 operably connected by a bus 640 to a plurality of memory devices 650. In accordance with one embodiment of the present disclosure, the host device 610 can communicate with a first one of the memory devices 650 (e.g., via a read command, a write command, etc. communicated over the bus 640), and with one or more of the other memory devices 650 to transmit an on-die termination signal (e.g., such as on-die termination signal 341 in timing diagram 300, on-die termination signal 441 in timing diagram 400, or on-die termination signal 541 in timing diagram 500). In an alternative embodiment, the controller 630 can communicate with a first one of the memory devices 650 (e.g., via a read command, a write command, etc. communicated over the bus 640), and with one or more of the other memory devices 650 to transmit an on-die termination signal (e.g., such as on-die termination signal 341 in timing diagram 300, on-die termination signal 441 in timing diagram 400, or on-die termination signal 541 in timing diagram 500). In this regard, the controller 630 can intermediate between the host device 610 (e.g., which may send a communication (e.g., read, write, etc.) command to a targeted memory device concurrently with an ODT command directed at the non-targeted memory devices) and the memory devices 650 to provide the command to the targeted memory device with either a modified ODT command (e.g., indicating a duration corresponding to multiple communication events) or without providing the ODT command to the other memory devices (e.g., relying instead on the non-targeted memory device to either remain in a previously-commanded ODT mode or to revert to a previously-commanded ODT mode).

Figure 7:
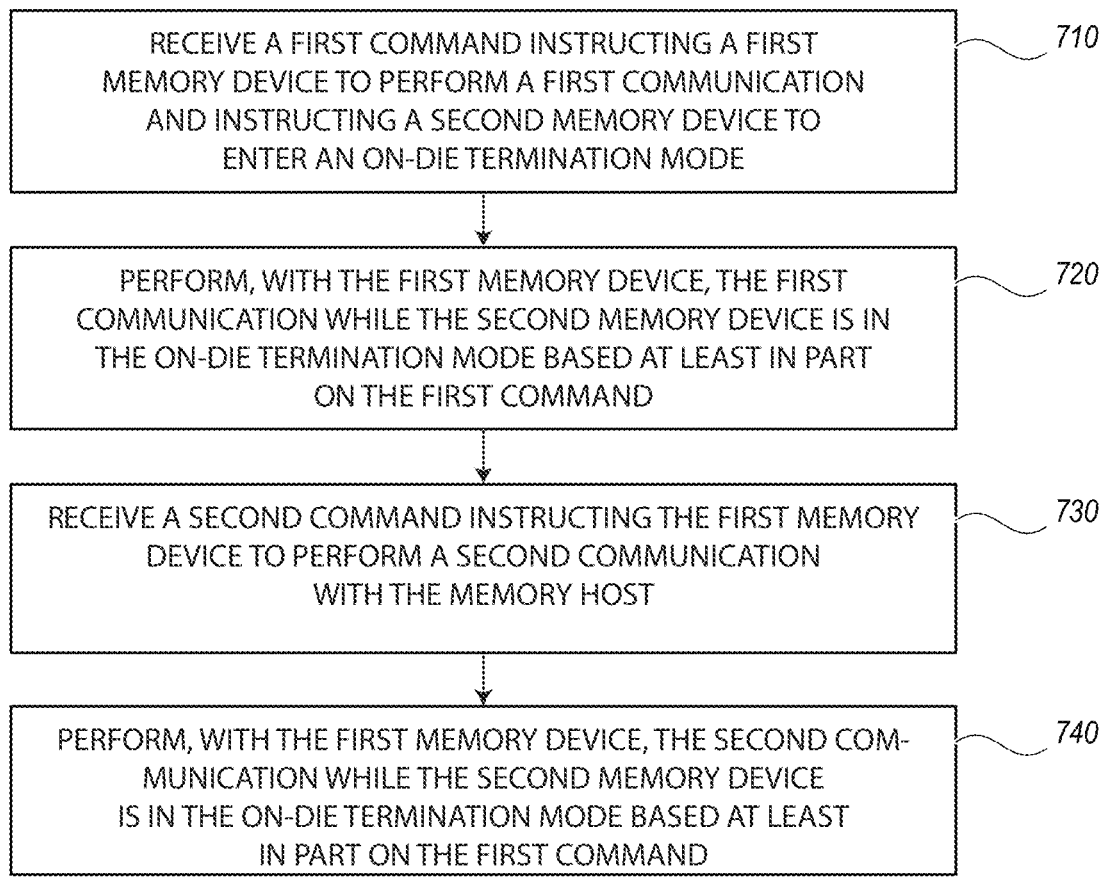
FIGS. 7-10 are flow charts illustrating methods of operating memory devices and memory systems in accordance with embodiments of the present technology.

FIG. 7 is a flow chart illustrating a method of operating a memory system in accordance with an embodiment of the present technology. The method includes receiving a first command instructing a first memory device of the memory system to perform a first communication and instructing a second memory device of the memory system to enter an on-die termination mode (box 710). According to one aspect of the present disclosure, the command receiving features of box 710 may be implemented with a command/address input circuit 105 and/or terminals connected thereto, as illustrated in FIG. 1 in greater detail, above.

The method further includes performing, with the first memory device, the first communication while the second memory device is in the on-die termination mode based at least in part on the first command (box 720). According to one aspect of the present disclosure, the communication features of box 720 may be implemented with a memory array 150, decoders (e.g., address decoder 110, command decoder 115, row decoder 140, column decoder 145, etc.) connected thereto, and/or IO circuit 160, as illustrated in FIG. 1 in greater detail, above.

The method further includes receiving a second command instructing the first memory device to perform a second communication with the memory host (box 730), and performing, with the first memory device, the second communication while the second memory device is in the on-die termination mode based at least in part on the first command (box 740). According to one aspect of the present disclosure, the command receiving and communication features of boxes 730 and 740 may be implemented with a command/address input circuit 105 and/or terminals connected thereto, a memory array 150, decoders (e.g., address decoder 110, command decoder 115, row decoder 140, column decoder 145, etc.) connected thereto, and/or IO circuit 160, as illustrated in FIG. 1 in greater detail, above.

Figure 8:
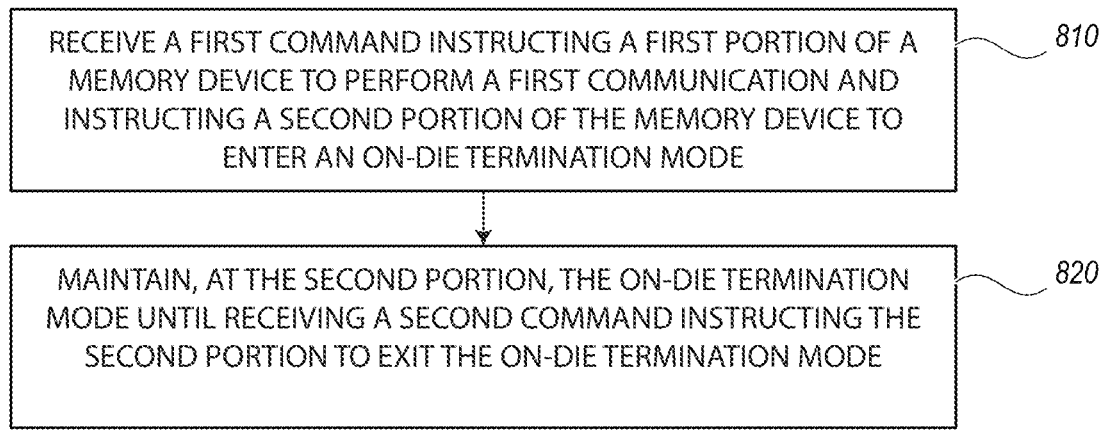

FIG. 8 is a flow chart illustrating a method of operating a memory device in accordance with an embodiment of the present technology. The method includes receiving a first command at the memory device instructing the first portion to perform a first communication and instructing the second portion to enter an on-die termination mode (box 810). According to one aspect of the present disclosure, the command receiving features of box 810 may be implemented with a command/address input circuit 105 and/or terminals connected thereto, as illustrated in FIG. 1 in greater detail, above.

The method further includes maintaining, at the second portion, the on-die termination mode until receiving a second command instructing the second portion to exit the on-die termination mode (box 820). According to one aspect of the present disclosure, the on-die termination mode maintaining features of box 820 may be implemented with a command/address input circuit 105, a clock input circuit 120, an IO circuit 160, and/or any terminals connected thereto, as illustrated in FIG. 1 in greater detail, above.

Figure 9:
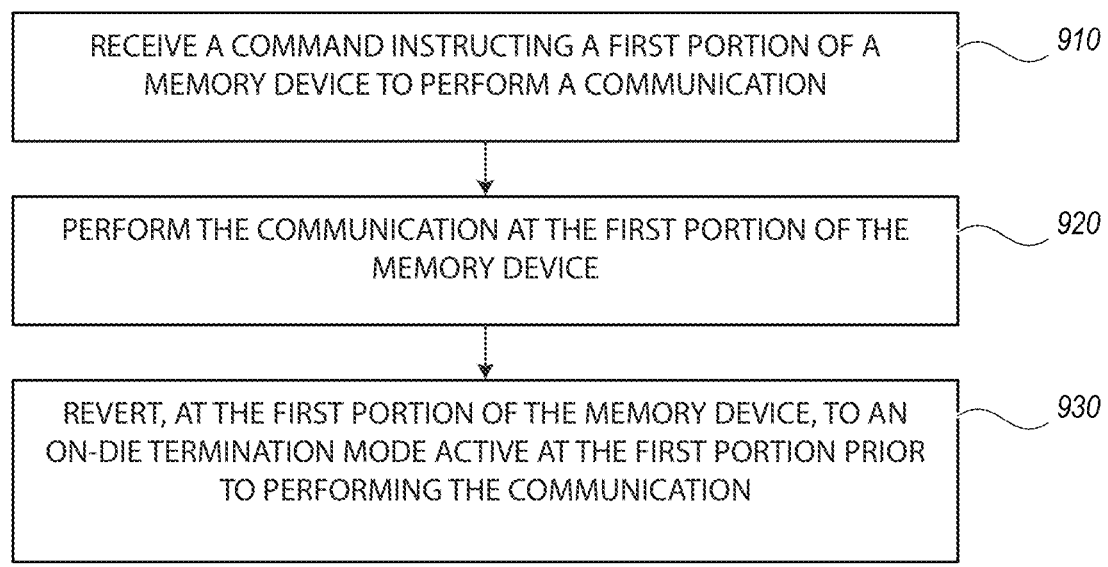

FIG. 9 is a flow chart illustrating a method of operating a memory device in accordance with an embodiment of the present technology. The method includes receiving a command at the memory device instructing a first portion of the memory device to perform a communication (box 910). According to one aspect of the present disclosure, the command receiving features of box 910 may be implemented with a command/address input circuit 105 and/or terminals connected thereto, as illustrated in FIG. 1 in greater detail, above.

The method further includes performing the communication at the first portion of the memory device (box 920), and reverting, at the first portion of the memory device, to an on-die termination mode active at the first portion prior to performing the communication (box 930). According to one aspect of the present disclosure, the communication performing features and on-die termination mode reverting features of boxes 920 and 930 may be implemented with a memory array 150, decoders (e.g., address decoder 110, command decoder 115, row decoder 140, column decoder 145, etc.) connected thereto, input circuits (e.g., command/address input circuit 105, clock input circuit 120, etc.), and/or IO circuit 160, as illustrated in FIG. 1 in greater detail, above.

Figure 10:
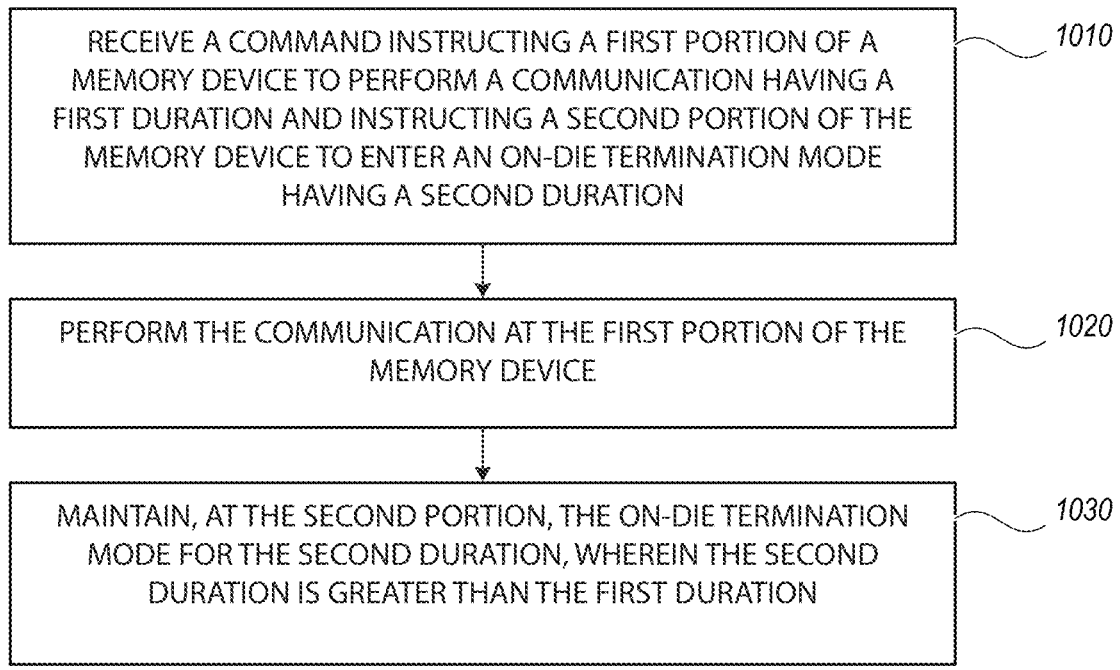

FIG. 10 is a flow chart illustrating a method of operating a memory device in accordance with an embodiment of the present technology. The method includes receiving a command at the memory device instructing a first portion of the memory device to perform a communication having a first duration and instructing a second portion of the memory device to enter an on-die termination mode having a second duration (box 1010). According to one aspect of the present disclosure, the command receiving features of box 1010 may be implemented with a command/address circuit 105 and/or terminals connected thereto, as illustrated in FIG. 1 in greater detail, above.

The method further includes performing the communication at the first portion of the memory device (box 1020), and maintaining, at the second portion, the on-die termination mode for the second duration, wherein the second duration is greater than the first duration (box 1030). According to one aspect of the present disclosure, the communication performing features and on-die termination mode maintaining features of boxes 1020 and 1030 may be implemented with a memory array 150, decoders (e.g., address decoder 110, command decoder 115, row decoder 140, column decoder 145, etc.) connected thereto, input circuits (e.g., command/address input circuit 105, clock input circuit 120, etc.), and/or IO circuit 160, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of operating a memory system, comprising:
   receiving a first command instructing a memory device of the memory system to enter an on-die termination mode;
   in response to the first command, placing the memory device in the on-die termination mode; and
   maintaining the memory device in the on-die termination mode for longer than a duration of a data communication of the memory system.

2. The method of claim 1, wherein the first command includes a number of bursts or clock cycles for which the memory device is to remain in the on-die termination mode.

3. The method of claim 1, wherein maintaining the memory device in the on-die termination mode for longer than a duration of the data communication of the memory system comprises maintaining the memory device in the on-die termination mode until receiving a second command instructing the memory device to exit the on-die termination mode.

4. The method of claim 1, further comprising:
   receiving a second command instructing the memory device to exit the on-die termination mode; and
   in response to the second command, exiting the memory device from the on-die termination mode.

5. The method of claim 1, wherein the data communication is a first data communication, the method further comprising:
   receiving a second command subsequent to the first command, the second command instructing the memory device to perform a second data communication; and
   in response to the second command:
      exiting the memory device from the on-die termination mode;
      performing, with the memory device, the second data communication; and
      reverting the memory device to the on-die termination mode after performing the second data communication.

6. The method of claim 5, wherein the second data communication is one of a read or a write operation.

7. The method of claim 1, wherein the memory device is a dynamic random access memory (DRAM) device.

8. A method of operating a memory device, the method comprising:
   receiving a first command at the memory device instructing a portion of the memory device to enter an on-die termination mode;
   receiving a second command instructing the portion to exit the on-die termination mode; and
   maintaining, at the portion, the on-die termination mode based at least in part on the first command until receiving the second command.

9. The method of claim 8, wherein the portion corresponds to a channel of the memory device.

10. The method of claim 8, wherein the second command further instructs the portion to perform a communication, and wherein the portion is configured, in response to the command, to:
    perform the communication, and
    reverting to the on-die termination mode after performing the communication.

11. A memory device, comprising:
    circuitry configured to implement an on-die termination mode at a portion of the memory device;
    wherein the circuitry is configured, in response to a single command to the portion, to implement the on-die termination mode at the portion during more than one data communication of the memory device.

12. The memory device of claim 11, wherein the circuitry is configured to implement the on-die termination mode at the portion in response to a first command to implement the on-die termination mode, and to remain in the on-die termination mode until receiving a second command to exit the on-die termination mode.

13. The memory device of claim 11, wherein the circuitry is configured to implement the on-die termination mode at the portion until a threshold number of data communications are performed by the memory device, wherein the threshold number is indicated in the single command to the portion.

14. The memory device of claim 11, wherein the circuitry is configured to implement the on-die termination mode at the portion in response to a command instructing the portion to perform a data communication, wherein the memory portion is configured to automatically revert to the on-die termination mode following the data communication.

15. The memory device of claim 11, wherein the memory device is dynamic random access memory (DRAM) device.

16. The memory device of claim 11, wherein portion corresponds to a channel of the memory device.

* * * * *